United States Patent
Kotani et al.

(10) Patent No.: US 10,424,578 B2
(45) Date of Patent: Sep. 24, 2019

(54) SEMICONDUCTOR DEVICE AND METHOD OF MANUFACTURING THE SAME

(71) Applicant: SHINDENGEN ELECTRIC MANUFACTURING CO., LTD., Tokyo (JP)

(72) Inventors: Ryohei Kotani, Hanno (JP); Toshiki Matsubara, Hanno (JP); Nobutaka Ishizuka, Hanno (JP); Masato Mikawa, Hanno (JP); Hiroshi Oshino, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/567,523

(22) PCT Filed: Sep. 13, 2016

(86) PCT No.: PCT/JP2016/076989
§ 371 (c)(1),
(2) Date: Oct. 18, 2017

(87) PCT Pub. No.: WO2018/051416
PCT Pub. Date: Mar. 22, 2018

(65) Prior Publication Data
US 2018/0294257 A1 Oct. 11, 2018

(51) Int. Cl.
*H01L 27/02* (2006.01)
*H01L 29/78* (2006.01)
(Continued)

(52) U.S. Cl.
CPC ...... *H01L 27/0255* (2013.01); *H01L 21/8249* (2013.01); *H01L 21/823487* (2013.01);
(Continued)

(58) Field of Classification Search
CPC ............. H01L 27/0225; H01L 27/0365; H01L 21/8249; H01L 21/823487; H01L 27/629; H01L 29/7395
(Continued)

(56) References Cited

U.S. PATENT DOCUMENTS

| 4,079,402 A * | 3/1978 | Dunkey ................ H01L 29/866 257/606 |
| 2016/0036431 A1* | 2/2016 | Roig-Guitart ........ H03K 17/102 323/741 |

FOREIGN PATENT DOCUMENTS

| JP | 60-092675 A | 5/1985 |
| JP | 02-023673 A | 1/1990 |

(Continued)

OTHER PUBLICATIONS

International Search Report for Application No. PCT/JP2016/076989, dated Dec. 20, 2016 (3 pages).
(Continued)

*Primary Examiner* — Thinh T Nguyen
(74) *Attorney, Agent, or Firm* — Nutter McClennen & Fish LLP

(57) ABSTRACT

A semiconductor device of an embodiment includes a conductive semiconductor substrate, an insulating film formed on the semiconductor substrate, an overvoltage protection diode configured to be formed on the insulating film and to include an n-type semiconductor layer and a p-type semiconductor layer alternately arranged adjacent to each other, and an insulating film that covers the overvoltage protection diode. The concentration of the p-type impurities in the p-type semiconductor layer is lower than the concentration of the n-type impurities in the n-type semiconductor layer.

(Continued)

The concentration peak of the p-type impurities is disposed in a non-boundary region between a boundary region and a boundary region.

10 Claims, 8 Drawing Sheets

(51) Int. Cl.

| | | |
|---|---|---|
| H01L 29/40 | (2006.01) | |
| H01L 29/66 | (2006.01) | |
| H01L 29/739 | (2006.01) | |
| H01L 29/06 | (2006.01) | |
| H01L 21/8234 | (2006.01) | |
| H01L 21/8249 | (2006.01) | |
| H01L 27/06 | (2006.01) | |
| H01L 29/866 | (2006.01) | |
| H01L 29/16 | (2006.01) | |
| H01L 29/10 | (2006.01) | |

(52) U.S. Cl.
CPC ...... *H01L 27/0629* (2013.01); *H01L 27/0635* (2013.01); *H01L 29/0638* (2013.01); *H01L 29/404* (2013.01); *H01L 29/66333* (2013.01); *H01L 29/7395* (2013.01); *H01L 29/7808* (2013.01); *H01L 29/0619* (2013.01); *H01L 29/1095* (2013.01); *H01L 29/16* (2013.01); *H01L 29/66348* (2013.01); *H01L 29/7397* (2013.01); *H01L 29/866* (2013.01)

(58) Field of Classification Search
USPC .................. 257/140, 146, 156; 438/140, 141
See application file for complete search history.

(56) References Cited

FOREIGN PATENT DOCUMENTS

| | | |
|---|---|---|
| JP | 06-005885 A | 1/1994 |
| JP | 06-151896 A | 5/1994 |
| JP | 08-088354 A | 4/1996 |
| JP | 2004-296819 A | 10/2004 |
| JP | 2007-165424 A | 6/2007 |
| JP | 2009-111304 A | 5/2009 |

OTHER PUBLICATIONS

English translation of International Preliminary Report on Patentability, Chapter II, for Application No. PCT/JP2016/676989, dated March 14, 2019 (6 pages).

* cited by examiner

SEMICONDUCTOR DEVICE AND METHOD OF MANUFACTURING THE SAME

The present application claims priority under 35 U.S.C. § 365 to PCT/JP2016/076989, filed on Sep. 13, 2016, the disclosure of which are incorporated herein by reference.

TECHNICAL FIELD

The present invention relates to a semiconductor device and, more specifically, to a semiconductor device that has a MOS (Metal-Oxide-Semiconductor) structure and includes an overvoltage protection diode and a method of manufacturing the same.

BACKGROUND ART

Conventionally, semiconductor devices having what is called a MOS structure, such as IGBT (Insulated Gate Bipolar Transistor) and MOSFET (MOS Field Effect Transistor), have been known. Such MOS-type semiconductor devices use overvoltage protection diodes made up of series-connected Zener diodes as overvoltage protection measures. More specifically, in the overvoltage protection diodes, n-type semiconductor layers and p-type semiconductor layers are alternately arranged adjacent to each other (e.g., see Patent Literature 1). In the case of IGBT, overvoltage protection diodes are provided between a collector terminal and a gate terminal and a gate terminal and an emitter terminal.

As shown in FIG. 11, a p-type semiconductor layer 50b (and n-type semiconductor layer) of an overvoltage protection diode are arranged on an insulating film 140 formed on a semiconductor substrate 120, and is covered with an insulating film 150. That is, the overvoltage protection diode is interposed between two insulating films 140 and 150.

Typically, in an overvoltage protection diode, the p-type impurity concentration in a p-type semiconductor layer is lower than the n-type impurity concentration in an n-type semiconductor layer. Consequently, the breakdown voltage (Zener voltage) of an overvoltage protection diode is determined according to the position of a high concentration region (concentration peak) of p-type impurity concentration. In a conventional overvoltage protection diode, as shown in FIG. 11, the p-type impurity concentration is the maximum in a boundary region F10 between the p-type semiconductor layer 50b and the insulating film 150. Consequently, the overvoltage protection diode causes Zener breakdown in the boundary region F10.

CITATION LIST

Patent Literature

[Patent Literature 1] Japanese Patent Laid-Open No. 2009-111304

SUMMARY OF INVENTION

Technical Problem

Incidentally, in a process of manufacturing an MOS-type semiconductor device (heating step and the like), mobile ions, such as sodium, contained in the insulating film 150 and impurities, such as boron, may move to the p-type semiconductor layer 50b, and, on the contrary, impurities, such as boron, in the boundary region F10 of the p-type semiconductor layer 50b may move to the insulating film 150, in some cases. Such movement of mobile ions and impurities varies the potential of the boundary region F10 and varies the distribution of carrier concentrations (positive hole concentration etc.) in the p-type semiconductor layer 50b. Consequently, a state is achieved that is analogous to a state where the position of the high concentration region of the p-type impurity concentration is varied. As a result, the breakdown voltage of the overvoltage protection diode is largely varied. Conventionally, since it is difficult to control movement of mobile ions and impurities, it is difficult to stabilize the breakdown voltage of the overvoltage protection diode.

The present invention thus has an object to provide a semiconductor device that can reduce variation in the breakdown voltage of an overvoltage protection diode and a method of manufacturing the same.

Solution to Problem

A semiconductor device according to the present invention includes:

a conductive semiconductor substrate;

a first insulating film formed on the semiconductor substrate;

a Zener diode that is formed on the first insulating film and includes an n-type semiconductor layer and a p-type semiconductor layer arranged adjacent to each other; and a second insulating film that covers the Zener diode, a concentration of the p-type impurities in the p-type semiconductor layer being lower than a concentration of the n-type impurities in the n-type semiconductor layer, and a concentration peak of the p-type impurities being located in a non-boundary region between a first boundary region that is a boundary region of the p-type semiconductor layer with the first insulating film and a second boundary region that is a boundary region of the p-type semiconductor layer with the second insulating film.

In the semiconductor device, the concentration peak may be in an inner 80% region of a total thickness of the p-type semiconductor layer.

In the semiconductor device, the concentration peak may be at a position apart by at least 20 nm from a boundary between the p-type semiconductor layer and the first insulating film and a boundary between the p-type semiconductor layer and the second insulating film.

In the semiconductor device, n-type impurities may be implanted in the first boundary region and/or the second boundary region of the p-type semiconductor layer.

In the semiconductor device, the p-type semiconductor layer and the n-type semiconductor layer may be made of polysilicon, and the first insulating film and/or the second insulating film may be made of silicon dioxide film.

In the semiconductor device, the p-type impurities may be boron.

In the semiconductor device, a MOS structure may be further included, principal current may flow from one principal surface to another principal surface of the semiconductor substrate, the one principal surface of the semiconductor substrate may include an active region through which the principal current flows, and a voltage supporting region that surrounds the active region and contains a peripheral portion of the semiconductor substrate, the first insulating film may be formed on the voltage supporting region, and the Zener diode may be an overvoltage protection diode configured to include the n-type semiconductor layer and the p-type semiconductor layer alternately arranged adjacent to each other.

In the semiconductor device, the semiconductor substrate may be of a first conductive type, the semiconductor device may further include:

a second conductive type diffusion layer that is selectively formed on one principal surface in the voltage supporting region, and surrounds the active region;

a first conductive type diffusion region formed in the diffusion layer;

an emitter electrode formed on the diffusion region;

a gate electrode formed on the overvoltage protection diode;

a second conductive type collector region formed on another principal surface of the semiconductor substrate; and a collector electrode formed on the collector region.

In the semiconductor device, the semiconductor substrate may be of a first conductive type, the semiconductor device may further include:

a second conductive type diffusion layer that is selectively formed on one principal surface in the voltage supporting region, and surrounds the active region;

a first conductive type diffusion region formed in the diffusion layer;

an emitter electrode formed on the diffusion region;

a gate electrode formed on the overvoltage protection diode;

a first conductive type drain region formed on another principal surface of the semiconductor substrate; and a collector electrode that is formed on the drain region, and forms a Schottky barrier together with the drain region.

In the semiconductor device, the semiconductor substrate may be of a first conductive type, and the semiconductor device may further include:

a second conductive type diffusion layer that is selectively formed on one principal surface in the voltage supporting region, and surrounds the active region;

a first conductive type diffusion region formed in the diffusion layer;

a source electrode formed on the diffusion region;

a gate electrode formed on the overvoltage protection diode;

a first conductive type drain region formed on another principal surface of the semiconductor substrate; and a drain electrode formed on the drain region.

A method of manufacturing a semiconductor device according to the present invention includes:

forming a first insulating film on a semiconductor substrate;

forming a semiconductor layer on the first insulating film;

etching the semiconductor layer;

oxide film forming that forms an oxide film on the etched semiconductor layer;

p-type impurity implanting that implants p-type impurities into the semiconductor layer through the oxide film;

n-type impurity implanting that selectively implants n-type impurities into the semiconductor layer; and forming a second insulating film on the semiconductor layer, in the p-type impurity implanting, the p-type impurities being implanted so that a concentration peak of the implanted p-type impurities is located in a non-boundary region between a first boundary region that is a boundary region of the semiconductor layer with the first insulating film and a second boundary region that is a boundary region of the semiconductor layer with the second insulating film.

The method of manufacturing the semiconductor device may further include implanting, into the semiconductor layer, n-type impurities having a lower concentration than a concentration of p-type impurities scheduled to be implanted in the p-type impurity implanting, before the p-type impurity implanting.

In the method of manufacturing the semiconductor device, n-type impurities may be implanted also into the first insulating film, in the implanting of the n-type impurities into the MOS structure formation region of the semiconductor substrate after forming the first insulating film and before forming the semiconductor layer, and subsequently, the n-type impurities implanted in the first insulating film may be diffused to the first boundary region of the semiconductor layer, through an annealing treatment that activates the n-type impurities implanted into the MOS structure formation region of the semiconductor substrate.

The method of manufacturing the semiconductor device may further include implanting, into the semiconductor substrate, n-type impurities for forming a surface high-concentration layer in the MOS structure formation reserved region, before forming the semiconductor layer, wherein, in the implanting, n-type impurities are also introduced into the first insulating film.

The method of manufacturing the semiconductor device may further include implanting n-type impurities having a lower concentration than a concentration of the p-type impurities implanted in the p-type impurity implanting, into at least a portion of the semiconductor layer where the n-type impurities have not been implanted in the n-type impurity implanting.

In the method of manufacturing the semiconductor device, in the p-type impurity implanting, the p-type impurities may be implanted so as to have the concentration peak being in an inner 80% region of a total thickness of the semiconductor layer.

In the method of manufacturing the semiconductor device, in the p-type impurity implanting, the p-type impurities may be implanted so as to have the concentration peak disposed apart by at least 20 nm from a boundary between the semiconductor layer and the first insulating film and a boundary between the semiconductor layer and the second insulating film.

Advantageous Effects of Invention

According to the present invention, the concentration peak of the p-type impurities in the p-type semiconductor layer is located in a non-boundary region between a first boundary region that is a boundary region of the p-type semiconductor layer with the first insulating film and a second boundary region that is a boundary region of the p-type semiconductor layer with the second insulating film. Accordingly, Zener breakdown occurs in the non-boundary region of the overvoltage protection diode. Consequently, the adverse effect of the movement of mobile ions and impurities on the breakdown voltage of the overvoltage protection diode can be suppressed.

The present invention can therefore reduce variation in the breakdown voltage of an overvoltage protection diode.

DESCRIPTION OF EMBODIMENTS

Figure 1:
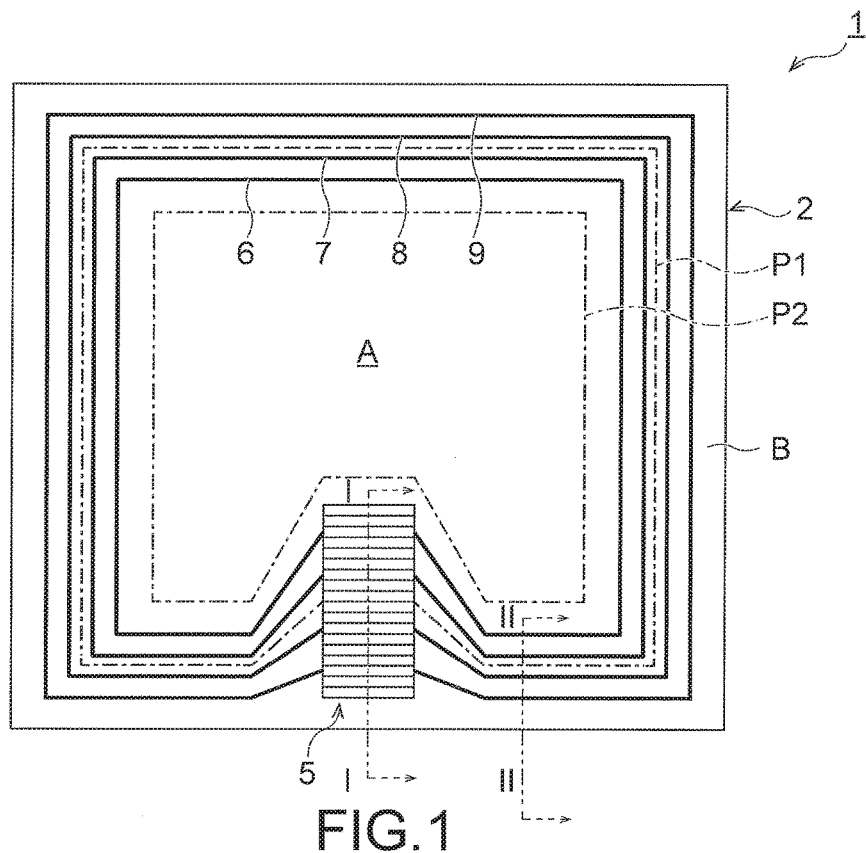
FIG. 1 is a plan view of a semiconductor device 1 (IGBT) according to a first embodiment.

Embodiments of the present invention are described with reference to the drawings. In each diagram, configuration elements having analogous functions are assigned the same signs.

(First Embodiment)

Referring to FIGS. 1 to 5, a semiconductor device 1 according to a first embodiment of the present invention is described. A plan view of a semiconductor device 1 shown in FIG. 1 does not illustrate an insulating film 15, a surface protecting film 16, an emitter electrode 21, a gate electrode 22, and a stopper electrode 24.

The semiconductor device 1 according to the first embodiment is IGBT having a MOS structure. Principal current flows between an upper surface 2a (one principal surface) and a lower surface 2b (the other principal surface) of a conductive semiconductor substrate 2. The semiconductor substrate 2 is a silicon substrate in this embodiment. The present invention is not limited thereto. Another semiconductor substrate (e.g., SiC substrate, GaN substrate, etc.) may be adopted. The conductive type of the semiconductor substrate 2 is an n-type in this embodiment. However, the type is not limited to this type.

As shown in FIG. 1, an active region A where principal current flows, and a voltage supporting region B that surrounds the active region A are disposed on the upper surface 2a of the semiconductor substrate 2. The voltage supporting region B includes a peripheral portion of the semiconductor substrate 2. Here, "peripheral portion" is a peripheral part of the semiconductor substrate 2 that includes the side surfaces of the semiconductor substrate 2.

Figure 2:
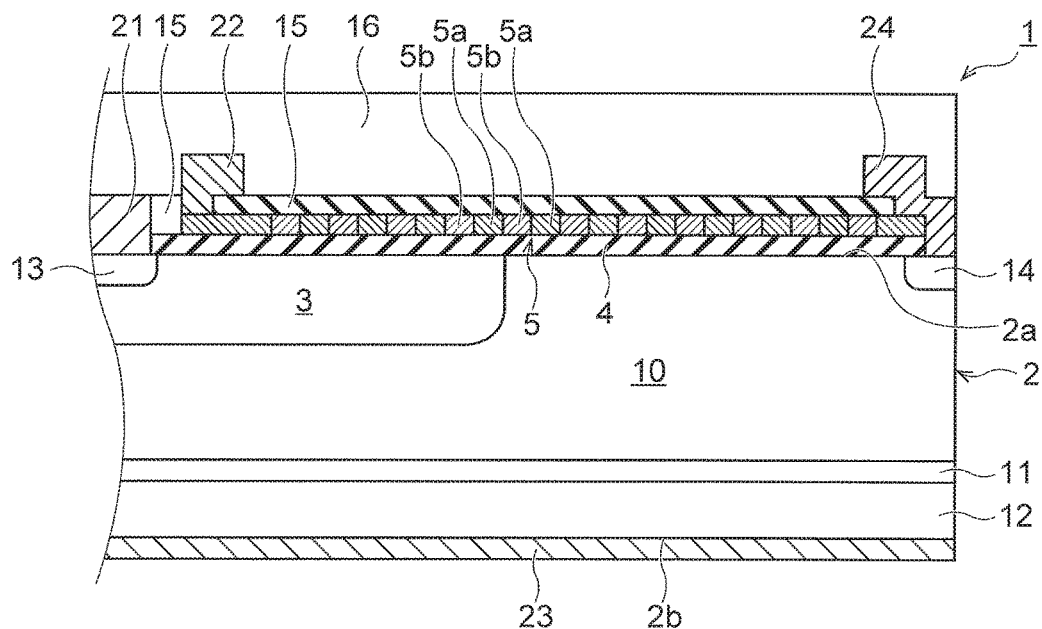
FIG. 2 is a sectional view taken along line I-I of FIG. 1.
Figure 3:
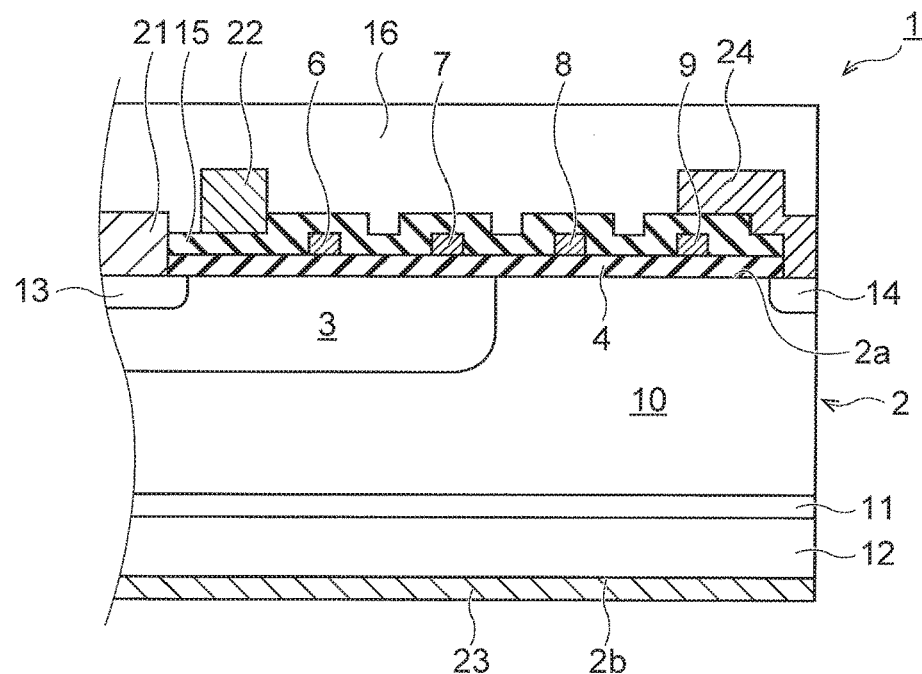
FIG. 3 is a sectional view taken along line II-II of FIG. 1.

As shown in FIGS. 1 to 3, the semiconductor device 1 includes: a p-type diffusion layer 3; an insulating film 4 (first insulating film); an insulating film 15 (second insulating film); an overvoltage protection diode 5; conductor portions 6, 7, 8 and 9; a p-type collector region 12; an n-type diffusion region 13; an n-type stopper region 14; a surface protecting film 16; an emitter electrode 21; a gate electrode 22; a collector electrode 23; and a stopper electrode 24. A gate pad (not shown) is provided on the upper surface 2a of the semiconductor substrate 2.

The diffusion layer 3 is selectively formed on the upper surface 2a of the voltage supporting region B, and surrounds the active region A. The diffusion layer 3 is also called a p-type base region. A region surrounded by boundaries P1 and P2 in FIG. 1 is the p-type base region. Here, the boundary P1 is the boundary of a p-n junction between the diffusion layer 3 and the peripheral semiconductor region 10. The boundary P2 is the boundary between the active region A and the voltage supporting region B. The peripheral semiconductor region 10 is an n-type semiconductor region disposed outside of the diffusion layer 3.

The semiconductor device 1 may further include a p-type diffusion layer (guard ring) provided so as to surround the diffusion layer 3 in order to achieve high voltage resistance. The guard ring is selectively formed on the upper surface 2a of the voltage supporting region B. The number of guard rings is not limited to one. The number may be two or more instead.

The impurity concentrations of the diffusion layer 3 and the guard ring are, for example, $1 \times 10^{14}$ to $1 \times 10^{19}$ cm$^{-3}$. The depths of the diffusion layer 3 and the guard ring are, for example, 2 to 10 μm. The impurity concentration of the peripheral semiconductor region 10 is, for example, $1 \times 10^{13}$ to $1 \times 10^{15}$ cm$^{-3}$.

The insulating film 4 is formed on the voltage supporting region B of the semiconductor substrate 2. In this embodiment, as shown in FIG. 2, the insulating film 4 is formed on the diffusion layer 3 and the peripheral semiconductor region 10. The insulating film 4 is, for example, silicon dioxide film ($SiO_2$) and, more specifically, field oxide film. The thickness of the insulating film 4 is, for example, 200 to 2000 nm.

The overvoltage protection diode 5 is made up of multiple Zener diodes connected in series. In this embodiment, the overvoltage protection diode 5 is an overvoltage protection diode provided between the collector electrode 23 and the gate electrode 22 of the semiconductor device 1. The configuration of the overvoltage protection diode according to the present invention may be applied to the overvoltage protection diode provided between the gate electrode 22 and the emitter electrode 21.

Figure 4:
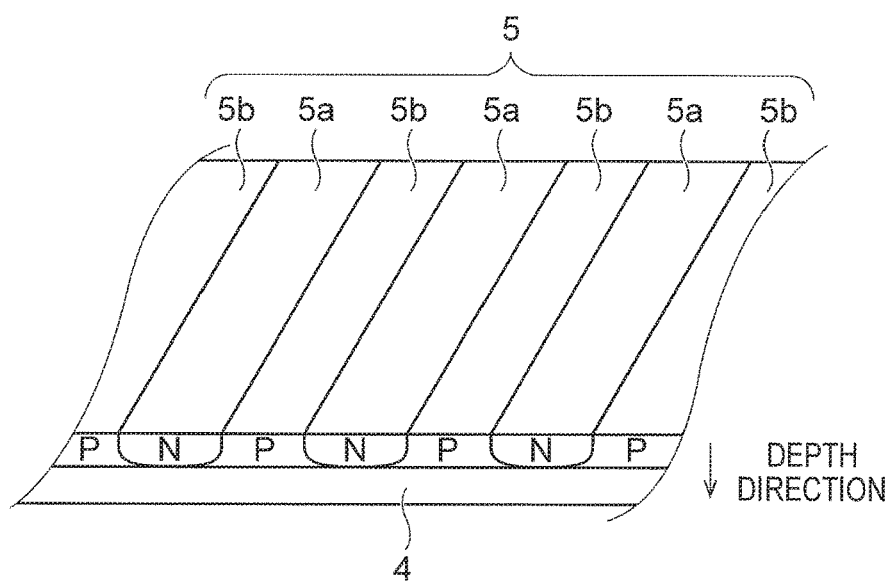
FIG. 4 is a partially enlarged perspective view of an overvoltage protection diode 5.

As shown in FIGS. 2 and 4, the overvoltage protection diode 5 is formed on the insulating film 4, and is configured by alternately arranging the n-type semiconductor layers 5a and the p-type semiconductor layers 5b in a manner adjacent to each other. The n-type semiconductor layers 5a and the p-type semiconductor layers 5b are formed on the insulating film 4 of the voltage supporting region B. Although the details will be described in the description of the method of manufacturing the semiconductor device 1, the overvoltage protection diode 5 is formed by forming a p-type semiconductor layer on the insulating film 4 and subsequently implanting n-type impurities into a predetermined region in the p-type semiconductor layer, for example.

The n-type semiconductor layers 5a and the p-type semiconductor layers 5b are made of conductive semiconductor (polysilicon to which impurities are introduced in this embodiment). More specifically, the n-type semiconductor layers 5a are polysilicon layers to which n-type impurities (phosphorus etc.) are introduced. The p-type semiconductor layers 5b are polysilicon layers to which p-type impurities (boron etc.) are introduced. The impurity concentration of the p-type semiconductor layer 5b is, for example, $1\times10^{17}$ to $1\times10^{19}$ cm$^{-3}$. The impurity concentration of the n-type semiconductor layer 5a is, for example, $1\times10^{19}$ to $1\times10^{21}$ cm$^{-3}$. Thus, the concentration of the p-type impurities in the p-type semiconductor layer 5b is lower than the concentration of the n-type impurities in the n-type semiconductor layer 5a. The thickness of the polysilicon layer is, for example, 100 to 1000 nm.

Figure 5:
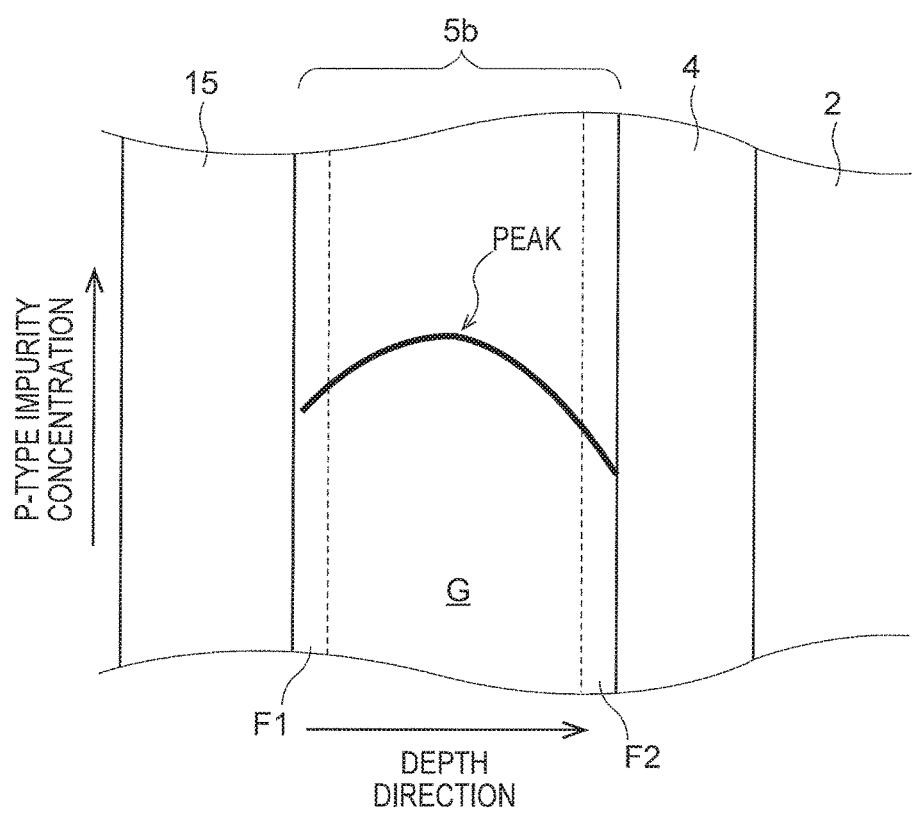
FIG. 5 is a diagram showing the profile of p-type impurity concentration in a p-type semiconductor layer 5b according to the embodiment.

As shown in FIG. 5, the concentration peak of the p-type impurities in the p-type semiconductor layer 5b is disposed in a non-boundary region G. Here, the non-boundary region G is a region between a boundary region F1 of the p-type semiconductor layer 5b with the insulating film 15 and a boundary region F2 of the p-type semiconductor layer 5b with the insulating film 4.

As shown in FIG. 1, the conductor portions 6, 7, 8 and 9 are formed on the insulating film 4 so as to surround the active region A along the voltage supporting region B, and are electrically connected to respective predetermined sites on the overvoltage protection diode 5. That is, the conductor portions 6, 7, 8 and 9 are electrically connected to the semiconductor layer (n-type semiconductor layers 5a or p-type semiconductor layers 5b) of the overvoltage protection diode 5 on the basis of respective required voltages. The semiconductor layer that is the connection destination is a semiconductor layer having the same conductive type as the conductor portions have. The conductor portions may be connected across two or more semiconductor layers.

The conductor portions 6, 7, 8 and 9 are made of, for example, polysilicon, or conductive material, such as aluminum. As shown in FIG. 3, the conductor portions 6 and 7 are arranged above the diffusion layer 3 with the insulating film 4 intervening therebetween. The conductor portions 8 and 9 are arranged above the peripheral semiconductor region 10 with the insulating film 4 intervening therebetween. The number of conductor portions is not limited to four. Any number of conductor portions may be adopted.

As shown in FIG. 2, the diffusion region 13 is an n-type semiconductor region formed in the diffusion layer 3. The emitter electrode 21 is formed on the diffusion region 13. The impurity concentration of the diffusion region 13 is, for example, $1\times10^{19}$ to $1\times10^{21}$ cm$^{-3}$.

As shown in FIGS. 2 and 3, the stopper region 14 is an n-type semiconductor region formed on the upper surface 2a at a side end of the semiconductor substrate 2. The impurity concentration of the stopper region 14 is higher than that of the peripheral semiconductor region 10. The stopper electrode 24 is electrically connected to the other end (right end in FIG. 2) of the overvoltage protection diode 5. The stopper electrode 24 is formed on the stopper region 14. The impurity concentration of the stopper region 14 is, for example, $1\times10^{19}$ to $1\times10^{21}$ cm$^{-3}$.

The gate electrode 22 is provided above the diffusion layer 3 with the insulating film 4 intervening therebetween. In this embodiment, the gate electrode 22 is formed on the overvoltage protection diode 5. More specifically, as shown in FIG. 2, the gate electrode 22 is electrically connected to one end (left end in FIG. 2) on the active region A side of the overvoltage protection diode 5.

The p-type collector region 12 is formed on the lower surface 2b of the semiconductor substrate 2. The impurity concentration of the collector region 12 is, for example, $1\times10^{17}$ to $1\times10^{19}$ cm$^{-3}$. As shown in FIG. 2, the collector electrode 23 is formed on the collector region 12. The n-type buffer region 11 is provided adjacent to the collector region 12. The impurity concentration of the buffer region 11 is, for example, $1\times10^{16}$ to $1\times10^{18}$ cm$^{-3}$.

As shown in FIG. 2, the insulating film 15 is provided so as to cover the overvoltage protection diode 5. The thickness of the insulating film 15 is, for example, 200 to 2000 nm. The insulating film 15 is, for example, silicon dioxide film, and is BPSG (Boron Phosphorous Silicate Glass) in this embodiment.

As shown in FIG. 2, the surface protecting film 16 covers the entire upper surface 2a side of the semiconductor device 1. The surface protecting film 16 is, for example, polyimide film or silicon nitride film.

As described above, in the semiconductor device 1 according to this embodiment, the concentration peak of the p-type impurities in the p-type semiconductor layer 5b is at the non-boundary region G between the boundary region F1 and the boundary region F2. Accordingly, the overvoltage protection diode 5 causes Zener breakdown in the non-boundary region G. Consequently, even in a case of movement of mobile ions or impurities, more specifically, a case where mobile ions or impurities move across the boundary region F1 and the p-type semiconductor layer 5b or across the boundary region F2 and the p-type semiconductor layer 5b, the breakdown voltage variation of the overvoltage protection diode 5 can be suppressed. Thus, this embodiment can reduce the breakdown voltage variation of the overvoltage protection diode 5. That is, the breakdown voltage of the overvoltage protection diode 5 can be stabilized.

Preferably, each of the boundary regions F1 and F2 is a region of outer 10% of the total thickness of the p-type semiconductor layer 5b. In other words, preferably, the non-boundary region G is a region of inner 80% of the total thickness of the p-type semiconductor layer 5b. In this case, the concentration peak of the p-type impurities in the p-type semiconductor layer 5b is at the region of inner 80% of the total thickness of the p-type semiconductor layer 5b. Thus, the adverse effect on the breakdown voltage of the overvoltage protection diode 5 applied by movement of the mobile ions (sodium ions etc.) and impurities (boron etc.) between the p-type semiconductor layer 5b and the insulating film 4 and/or between the p-type semiconductor layer 5b and the insulating film 15 can be sufficiently suppressed. As a result, the breakdown voltage of the overvoltage protection diode 5 can be further stabilized.

Note that, preferably, the concentration peak of the p-type impurities in the p-type semiconductor layer 5b is at a position apart by at least 20 nm (more preferably, at least 50 nm) from the boundary between the p-type semiconductor layer 5b and the insulating film 4 and from the boundary between the p-type semiconductor layer 5b and the insulating film 15. Thus, the adverse effect on the breakdown voltage of the overvoltage protection diode 5 applied by movement of the mobile ions, such as sodium ions, and impurities, such as boron between the p-type semiconductor layer 5b and the insulating film 4 and/or the p-type semiconductor layer 5b and the insulating film 15, can be sufficiently suppressed. As a result, the breakdown voltage of the overvoltage protection diode 5 can be further stabilized.

Furthermore, n-type impurities may be implanted into the boundary region F1 and/or the boundary region F2. Thus, the carrier concentration (positive hole concentration etc.) in the boundary region can be reduced owing to the n-type impurities, and the unevenness of the breakdown voltage (Zener voltage) of the overvoltage protection diode 5 can be further reduced. Note that the concentration of the n-type impurities is lower than the concentration of the p-type impurities, and is about $1\times10^{15}$ to $1\times10^{17}$ cm$^{-3}$, for example.

<Method of Manufacturing Semiconductor Device 1>

Next, a method of manufacturing the semiconductor device 1 is described with reference to sectional views of processes of FIGS. 6A, 6B and 6C. Note that, in FIGS. 6A, 6B and 6C, left diagrams indicate MOS structure formation regions, and right diagrams indicate overvoltage protection diode formation regions.

First, a conductive semiconductor substrate is prepared. In this embodiment, a relatively low concentration n-type semiconductor substrate 2 is prepared. As shown in step (1) of FIG. 6A, a p-type diffusion layer 3 is selectively formed on an upper surface 2a of the semiconductor substrate 2. Subsequently, an insulating film 4 is formed over the entire upper surface 2a of the semiconductor substrate 2. In this embodiment, a field oxide film is formed as the insulating film 4.

Next, a predetermined region (MOS structure formation region) of the insulating film 4 is etched off. Subsequently, as shown in step (1) of FIG. 6A, n-type impurities (phosphorus or the like) are selectively implanted into the MOS structure formation region by a selective ion implantation method. The concentration of the introduced n-type impurities is, for example, $1\times10^{15}$ to $1\times10^{17}$ cm$^{-3}$.

Figure 6A:
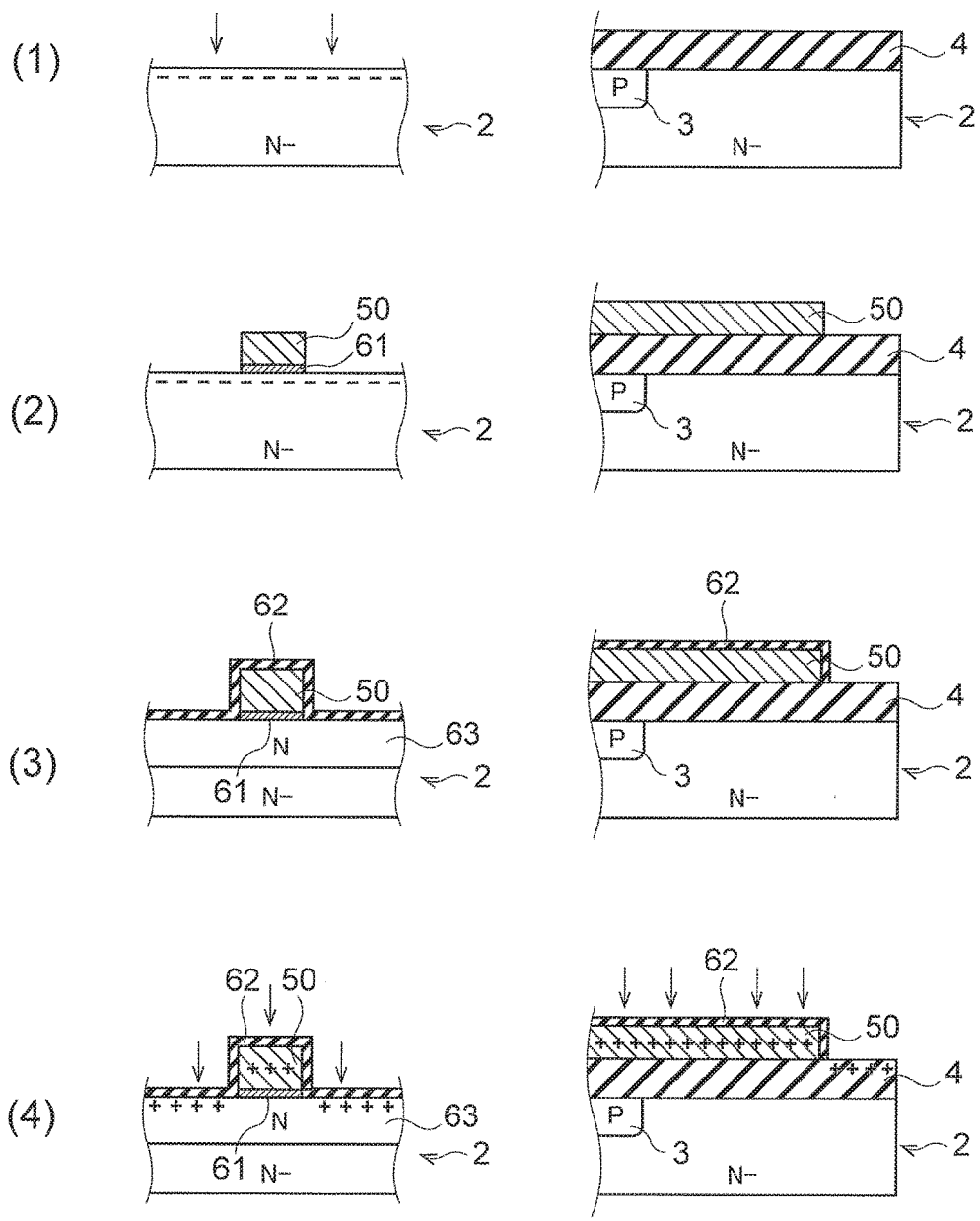
FIG. 6A is a sectional view of processes for illustrating a method of manufacturing a semiconductor device 1 according to the embodiment.

Next, as shown in step (2) of FIG. 6A, a gate oxide film 61 is formed in the MOS structure formation region. Subsequently, a polysilicon layer (semiconductor layer) 50 is formed on the gate oxide film 61 and the insulating film 4. The gate oxide film 61 and the polysilicon layer 50 in the MOS structure formation region are then formed to have a predetermined gate form by etching. Note that the external forms of the overvoltage protection diode 5 and the conductor portions 6, 7, 8 and 9 (in the case of polysilicon) are formed by etching the polysilicon layer 50.

Next, as shown in step (3) of FIG. 6A, the semiconductor substrate 2 is subjected to a heating treatment (annealing). Thus, the n-type impurities implanted in the MOS structure formation region are diffused and activated to form an n-type region (n-well, surface high-concentration layer) 63 and to form an oxide film 62 over the entire surface on the upper surface 2a side of the semiconductor substrate 2 (oxide film formation process). As a result, the oxide film 62 is formed on the etched polysilicon layer 50. The oxide film 62 is a thermally oxidized film formed by heating the semiconductor substrate 2.

Next, as shown in step (4) of FIG. 6A, p-type impurities (boron or the like) are implanted through the oxide film 62 into the polysilicon layer 50 and the n-type region 63 (p-type impurity implantation process). In this process, the p-type impurities implanted in the polysilicon layer 50 are deeply implanted so that the concentration peak of the p-type impurities can be disposed in the non-boundary region G between the boundary region F1 and the boundary region F2. The concentration of the implanted p-type impurities is, for example, $1\times10^{16}$ to $1\times10^{18}$ cm$^{-3}$.

Preferably, in the p-type impurity implantation process, the p-type impurities are implanted so that the concentration peak of the p-type impurities can be disposed in an inner 80% region of the total thickness of the polysilicon layer 50.

Preferably, in the p-type impurity implantation process, the p-type impurities are implanted so that the concentration peak of the p-type impurities can be disposed apart by at least 20 nm (more preferably, at least 50 nm) from the boundary between the polysilicon layer 50 and the insulating film 4 and from the boundary between the polysilicon layer 50 and the insulating film 15.

In a case where p-type impurities are implanted by an ion implantation method, ions are implanted at an acceleration energy (e.g., 100 eV) higher than a typical case (e.g., 50 eV). In the p-type impurity implantation process, the p-type impurities are implanted into the polysilicon layer 50, and also into a MOS formation reserved region of the semiconductor substrate 2 to thereby constituting a part of a MOS structure. Thus, the manufacturing method can become efficient.

Figure 6B:
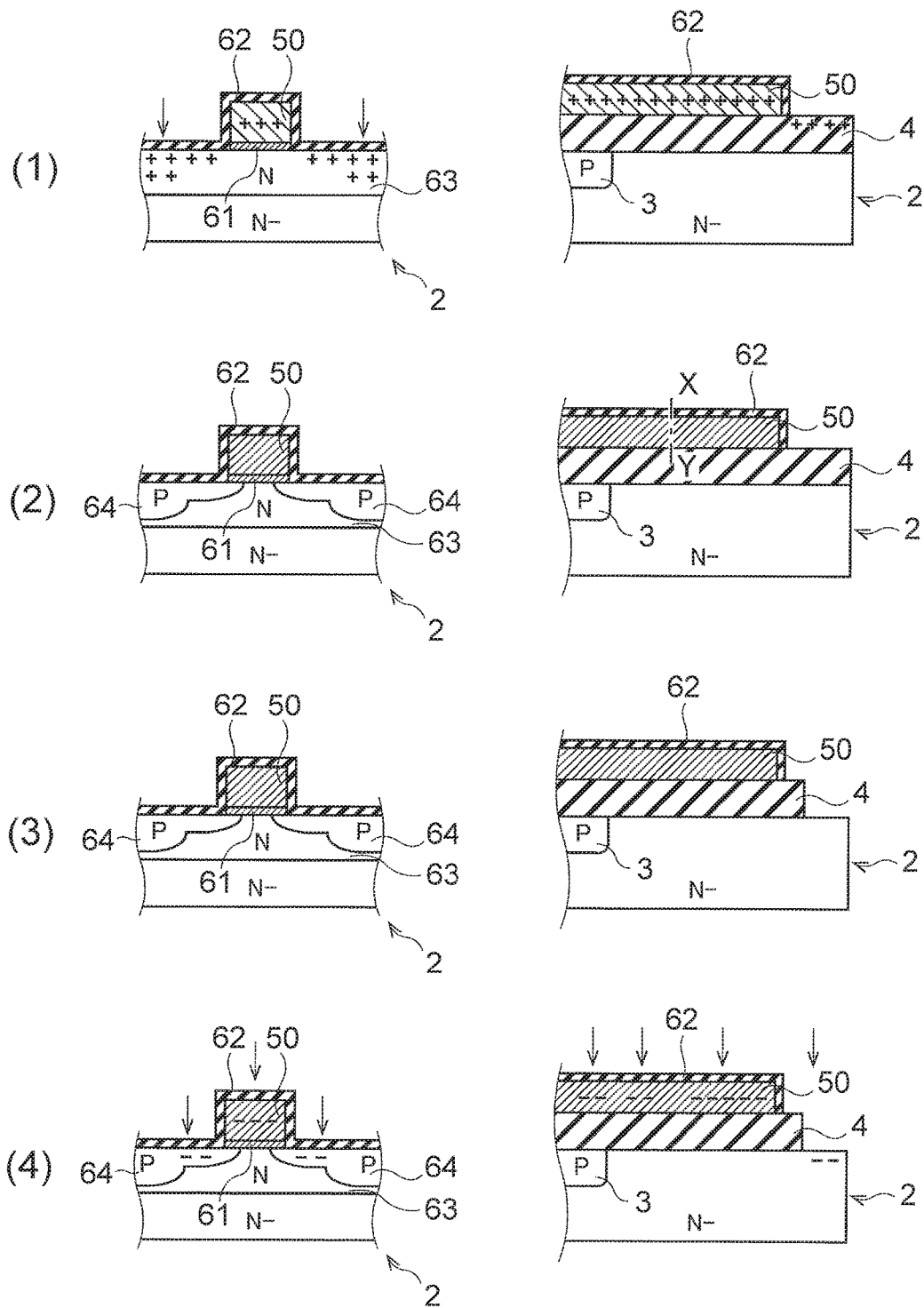
FIG. 6B is a sectional view of processes for illustrating the method of manufacturing the semiconductor device 1 subsequent to FIG. 6A according to the embodiment.

Next, as shown in step (1) of FIG. 6B, to form a body region having a predetermined form, p-type impurities (boron or the like) are deeply introduced into the MOS structure formation region by the selective ion implantation method. The concentration of the implanted p-type impurities is, for example, $1\times10^{16}$ to $1\times10^{18}$ cm$^{-3}$.

Next, as shown in step (2) of FIG. 6B, the semiconductor substrate 2 is subjected to a heating treatment (annealing), which diffuses and activates the implanted p-type impurities to cause the polysilicon layer 50 to be a p-type semiconductor layer, and forms a p-type region (body region) 64 in the n-type region 63.

Next, as shown in step (3) of FIG. 6B, the insulating film 4 at the peripheral portion of the semiconductor substrate 2 is etched off.

Next, as shown in step (4) of FIG. 6B, n-type impurities (phosphorus or the like) are selectively implanted, by the selective ion implantation method, into a predetermined region of the polysilicon layer 50, a predetermined region of the p-type region 64, and the peripheral portion of the semiconductor substrate 2 (n-type impurity implantation process). More specifically, n-type impurities are implanted into a portion of the polysilicon layer 50 where the n-type semiconductor layer 5a is to be formed, and a portion of the p-type region 64 where a source-drain region is to be formed. Note that the concentration of the implanted n-type impurities is, for example, $1\times10^{19}$ to $1\times10^{21}$ cm$^{-3}$. Alternatively, in this process, n-type impurities may be implanted into the polysilicon layer 50 from which the conductor portions 6, 7, 8 and 9 are to be made.

Figure 6C:
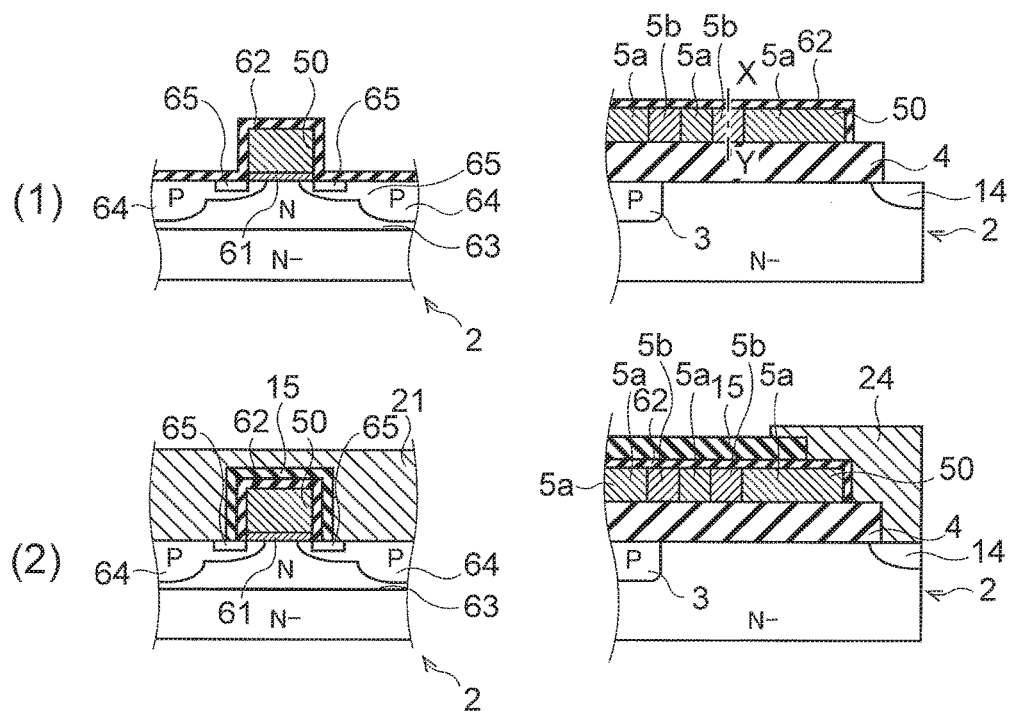
FIG. 6C is a sectional view of processes for illustrating the method of manufacturing the semiconductor device 1 subsequent to FIG. 6B according to the embodiment.

Next, as shown in step (1) of FIG. 6C, the semiconductor substrate 2 is subjected to a heating treatment (annealing), which diffuses and activates the implanted n-type impurities to cause the predetermined regions of the polysilicon layer 50 and the p-type region 64, and the peripheral portion of the semiconductor substrate 2 to be n-type semiconductor layers. That is, the predetermined region of the polysilicon layer 50 is caused to be the n-type semiconductor layer 5a, and the predetermined region of the p-type region 64 is caused to be an N+ region (source-drain region) 65. Thus, the overvoltage protection diode 5 is formed such that the n-type semiconductor layer 5a and the p-type semiconductor layer 5b are arranged adjacent to each other. Furthermore, the n-type impurities implanted into the peripheral portion of the semiconductor substrate 2 are thus diffused and activated by the heating treatment, thereby forming a stopper region 14.

Subsequently, as shown in step (2) of FIG. 6C, the insulating film 15 that covers the polysilicon layer 50 (overvoltage protection diode 5) and the MOS-structured gate, is formed. An emitter electrode 21 and a stopper electrode 24 are then formed by sputtering, vacuum vapor deposition or the like.

In the description of the manufacturing method, the annealing treatment is applied immediately after implantation of the p-type impurities or n-type impurities. Alternatively, the annealing treatment may be integrally applied after completion of multiple impurity implantation processes. In the case where the oxide film 62 is left to the last as described above, the oxide film 62 and the insulating film 15 correspond to a second insulating film in claims of this application.

The method of manufacturing the semiconductor device described above may include a process of implanting n-type impurities into the polysilicon layer 50 (semiconductor layer) before the p-type impurity implantation process. The concentration of n-type impurities to be implanted is lower than the concentration of p-type impurities scheduled to be implanted in the p-type impurity implantation process (e.g., $1 \times 10^{15}$ to $1 \times 10^{17}$ cm$^{-3}$). Such processes reduce the carrier concentrations (positive hole concentrations etc.) in the boundary regions F1 and F2. Consequently, the adverse effects of mobile ions and impurities can be further suppressed. The breakdown voltage variation of the overvoltage protection diode 5 can therefore be further suppressed. The n-type impurities may be implanted over the entire surface of the polysilicon layer 50, or selectively implanted only into a portion that is to be the p-type semiconductor layer 5b. The n-type impurities may be implanted so that the concentration peak of the n-type impurities can be different from the concentration peak of the p-type impurities (preferably, the concentration peak can be in the boundary region F1 or F2).

In the impurity implantation process for forming the n-type region 63 (surface high-concentration layer) described with reference to step (1) of FIG. 6A, the n-type impurities may be implanted not only into the MOS structure formation reserved region of the semiconductor substrate 2 but also into the insulating film 4. That is, in the process that is before formation of the polysilicon layer 50 (semiconductor layer) and is of implanting the n-type impurities for forming the surface high-concentration layer in the MOS structure formation reserved region, the n-type impurities may be implanted also into the insulating film 4. The n-type impurities thus implanted into the insulating film 4 diffuse in the boundary region F2 of the polysilicon layer 50 when the semiconductor substrate 2 is subjected to the heating treatment to form the n-type region 63 in the MOS structure formation region. Such processes reduce the carrier concentration (positive hole concentration etc.) in the boundary region F2 of the p-type semiconductor layer 5b. Consequently, the adverse effects of mobile ions and impurities can be further suppressed.

Figure 7:
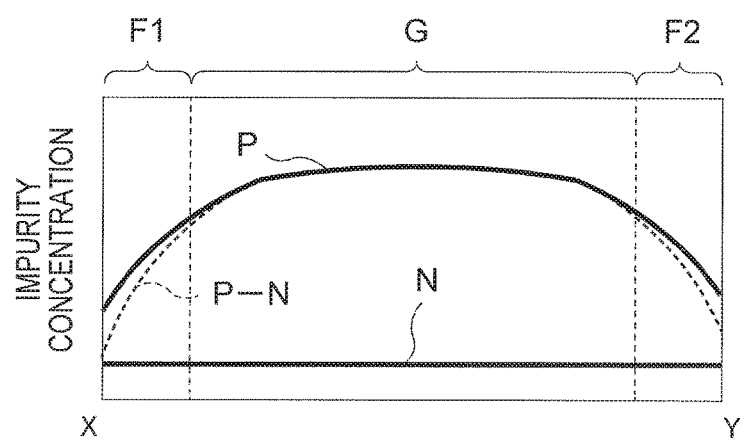
FIG. 7 is a diagram showing the profile of impurity concentration of the p-type semiconductor layer 5b according to the embodiment.

FIG. 7 shows the concentration distributions of the p-type impurities and the n-type impurities in the p-type semiconductor layer 5b after being subjected to the p-type impurity implantation process (after the annealing treatment). "P" indicates the concentration distribution of p-type impurities. "N" indicates the concentration distribution of n-type impurities. "P-N" indicates the substantial concentration of p-type impurities. As shown in FIG. 7, the substantial p-type impurity concentrations decrease in the boundary regions F1 and F2. That is, the carrier concentrations (positive hole concentrations) in the boundary regions F1 and F2 are reduced by n-type impurity implantation.

In the above description, the planar-gate type gate is fabricated in the MOS structure formation region. Without limitation thereto, a trench-gate type gate may be fabricated. Also in the case of fabricating the trench-gate type gate, the gate and the overvoltage protection diode can be fabricated in a manner analogous to that described above.

Not that one of methods of implanting the n-type impurities into the polysilicon layer 50 before the p-type impurity implantation process may be the following method. That is, in the process described with reference to step (1) of FIG. 6A (the process of selectively implanting the n-type impurities into the MOS structure formation region of the semiconductor substrate 2), the n-type impurities are implanted not only into the MOS structure formation region but also into the insulating film 4. Subsequently, the heating treatment (annealing treatment) described with reference to step (3) of FIG. 6A diffuses the n-type impurities in the insulating film 4 to the boundary region F2 of the polysilicon layer 50. Accordingly, the carrier concentration (positive hole concentration etc.) in the boundary region F2 can be reduced.

The method of manufacturing the semiconductor device may include, after the p-type impurity implantation process, a process (n*-type impurity implantation process) of implanting the n-type impurities into a portion which is of the polysilicon layer 50 (semiconductor layer) and in which the n-type impurities have not been implanted in the n-type impurity implantation process. The n*-type impurity implantation process may be performed before the n-type impurity implantation process described above, or after the n-type impurity implantation process.

The concentration of n-type impurities implanted in the n*-type impurity implantation process is lower than the concentration of p-type impurities implanted in the p-type impurity implantation process (e.g., $1 \times 10^{15}$ to $1 \times 10^{17}$ cm$^{-3}$). Such processes reduce the carrier concentration (positive hole concentration etc.) in the boundary region F1. Consequently, the adverse effects of mobile ions and impurities can be further suppressed. The breakdown voltage variation of the overvoltage protection diode 5 can therefore be further suppressed. Preferably, the ions are injected so that the concentration peak of the n-type impurities can be in the boundary region F1. The n-type impurities may be implanted over the entire surface of the polysilicon layer 50 (i.e., also into the region where the n-type impurities have been implanted in the n-type impurity implantation process).

Figure 8:
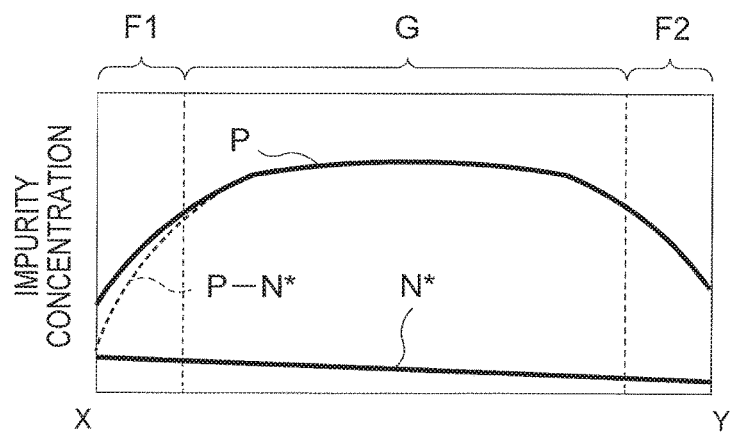
FIG. 8 is a diagram showing the profile of impurity concentration of the p-type semiconductor layer 5b according to the embodiment.

FIG. 8 shows the concentration distributions of the p-type impurities and the n-type impurities in the p-type semiconductor layer 5b after being subjected to the n*-type impurity implantation process (after the annealing treatment). "P" indicates the concentration distribution of p-type impurities. "N*" indicates the concentration distribution of n-type impurities. "P-N*" indicates the substantial concentration of p-type impurities. As shown in FIG. 8, the substantial p-type impurity concentration is reduced at least in the boundary region F1. That is, the carrier concentration (positive hole concentration) at least in the boundary region F1 is reduced by n-type impurity implantation.

<Modification of Semiconductor Device 1>

Figure 9:
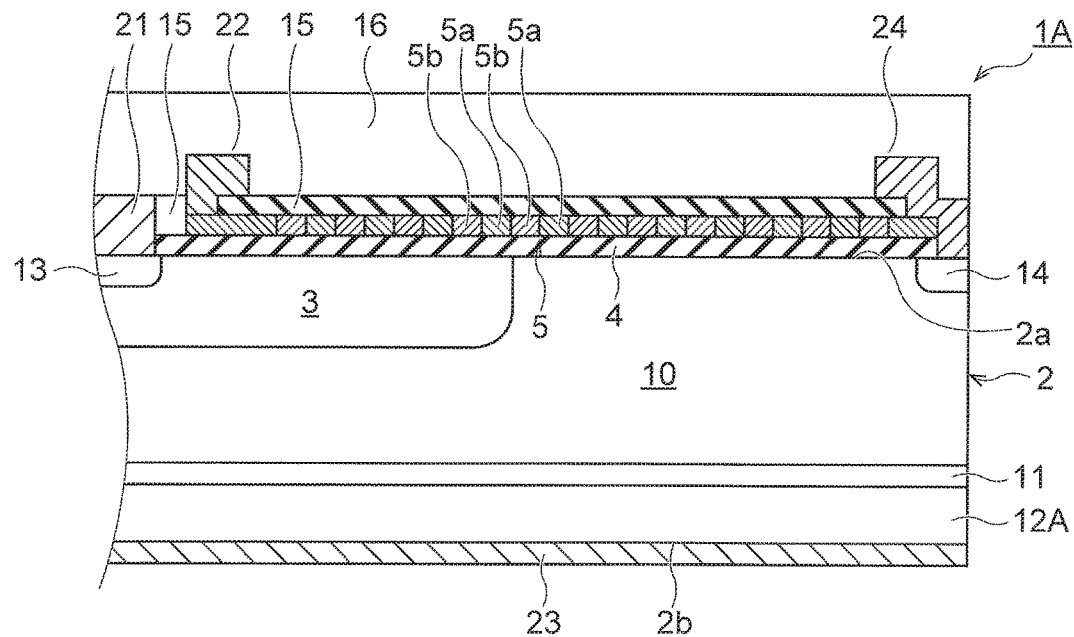
FIG. 9 is a sectional view of a semiconductor device 1A (IGBT) according to a modification of the first embodiment.

The configuration of IGBT is not limited to that of the semiconductor device 1. FIG. 9 is a sectional view of a semiconductor device 1A according to a modification of the first embodiment. In FIG. 9, the same configuration elements as those in FIG. 2 are assigned the same reference numerals.

As shown in FIG. 9, the semiconductor device 1A according to the modification includes an n-type drain region 12A instead of the p-type collector region 12, and a collector electrode 23 that forms Schottky barrier together with the drain region 12A. In this case, the collector electrode 23 includes barrier metal made of platinum, molybdenum, etc.

(Second Embodiment)

Figure 10:
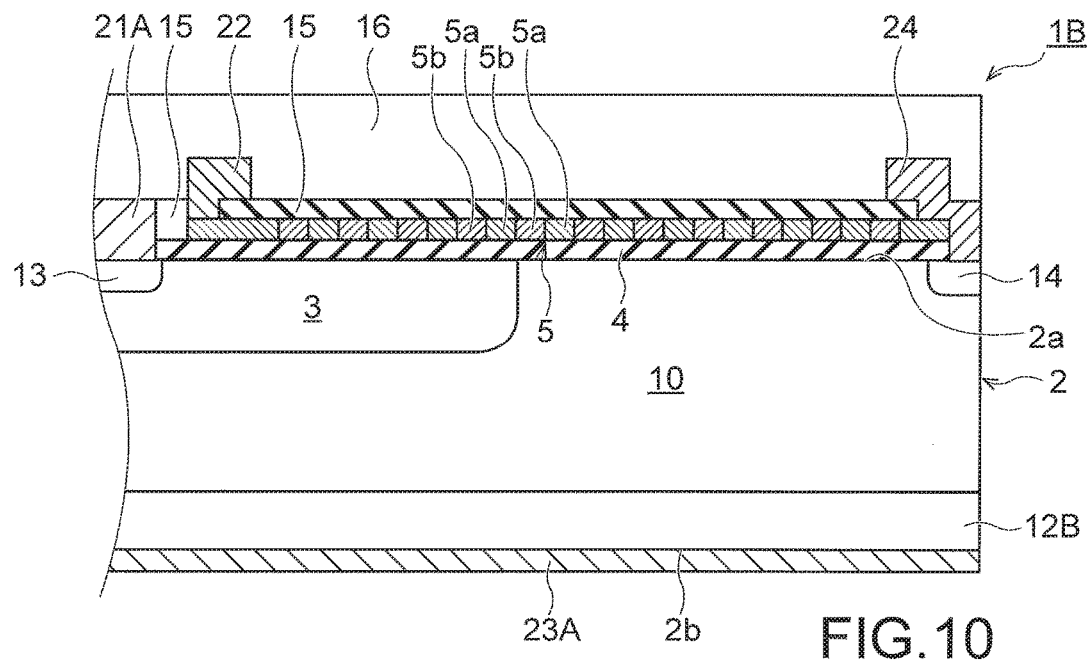
FIG. 10 is a sectional view of a semiconductor device 1B (vertical MOSFET) according to a second embodiment.
Figure 11:
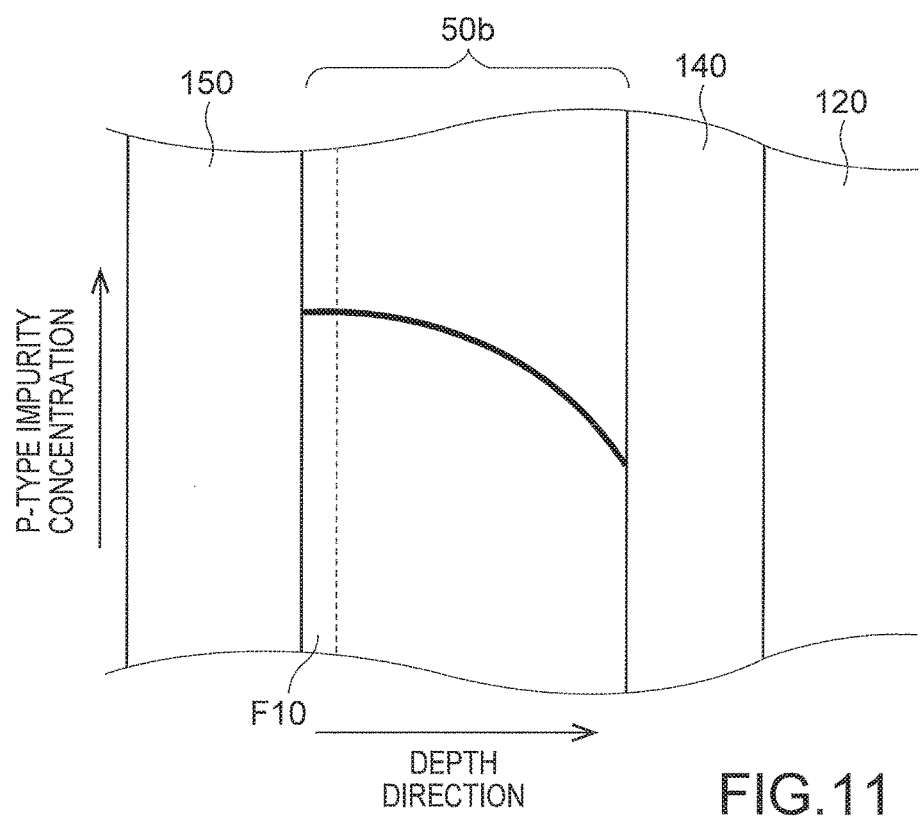
FIG. 11 is a diagram showing a profile of the p-type impurity concentration of a conventional p-type semiconductor layer 50b.

Next, a semiconductor device 1B according to a second embodiment of the present invention is described. The semiconductor device 1B is a vertical MOSFET. The plan view of the semiconductor device 1B is analogous to that of FIG. 1. FIG. 10 is a sectional view of the semiconductor device 1B, and corresponds to FIG. 2 described in the first embodiment. In FIG. 10, the same configuration elements as those in the first embodiment are assigned the same signs. Description is hereinafter made mainly on differences from the first embodiment.

The semiconductor device 1B includes: a p-type diffusion layer 3; an insulating film 4; an overvoltage protection diode 5; conductor portions 6, 7, 8 and 9; an n-type drain region 12B; an n-type diffusion region 13; an n-type stopper region 14; a source electrode 21A; a gate electrode 22; a drain electrode 23A; and a stopper electrode 24. The drain region 12B is formed on the lower surface 2b of the semiconductor substrate 2. The drain electrode 23A is formed on the drain region 12B. The source electrode 21A is formed on the diffusion region 13.

The overvoltage protection diode 5 is an overvoltage protection diode provided between the drain electrode 23A, which is a vertical MOSFET, and the gate electrode 22, or the source electrode 21A and the gate electrode 22.

The second embodiment can achieve the operation analogous to that in the case of the semiconductor device 1 described in the first embodiment. Consequently, the semiconductor device 1B that can suppress the breakdown voltage variation of the overvoltage protection diode 5 can be provided.

The overvoltage protection diodes 5 in the semiconductor devices according to the embodiments of the present invention have thus been described above. The application of the characteristic configuration of the overvoltage protection diode 5, that is, the configuration where the concentration peak of p-type impurities in the p-type semiconductor layer is in the non-boundary region G is not limited to the use application for overvoltage protection. Furthermore, the configuration may be applied to a general Zener diode for another use application, such as for a circuit for generating a reference voltage. For example, the configuration described above may be applied to a Zener diode that includes one n-type semiconductor layer and one p-type semiconductor layer. The application of the Zener diode according to the present invention is not limited to that in the case where the Zener diode is provided in a semiconductor device, such as IGBT or MOSFET, as the overvoltage protection diode. The Zener diode may be provided in another general integrated circuit (IC).

Based on the above description, those skilled in the art may imagine additional advantageous effects of the present invention and various modifications. However, the modes of the present invention are not limited to the individual embodiments described above. Configuration elements in different embodiments may be appropriately combined. Various types of addition, modification and partial deletion can be made within a range without departing from the conceptual thought and spirit of the present invention that can be derived from the content specified in the claims and equivalents thereof.

REFERENCE SIGNS LIST 1, 1A, 1B semiconductor device
2, 120 semiconductor substrate
2a upper surface
2b lower surface
3 diffusion layer
4, 140 insulating film
5 overvoltage protection diode
5a n-type semiconductor layer
5b, 50b p-type semiconductor layer
6, 7, 8, 9 conductor portion
10 peripheral semiconductor region
11 buffer region
12 collector region
12A, 12B drain region
13 diffusion region
14 stopper region
15, 150 insulating film
16 surface protecting film
21 emitter electrode
21A source electrode
22 gate electrode
23 collector electrode
23A drain electrode
24 stopper electrode
50 polysilicon layer
61 gate oxide film
62 oxide film
63 n-type region (surface high-concentration layer)
64 p-type region (body region)
65 N+ region
A active region
B voltage supporting region
F1, F2, F10 boundary region
G non-boundary region
P1, P2 boundary (of diffusion layer 3)

The invention claimed is:

1. A semiconductor device, comprising:
   a conductive semiconductor substrate;
   a first insulating film formed on the semiconductor substrate;
   a Zener diode that is formed on the first insulating film and includes an n-type semiconductor layer and a p-type semiconductor layer arranged adjacent to each other; and
   a second insulating film that covers the Zener diode,
   a concentration of the p-type impurities in the p-type semiconductor layer being lower than a concentration of the n-type impurities in the n-type semiconductor layer,
   a concentration peak of the p-type impurities being located in a non-boundary region between a first boundary region that is a boundary region of the p-type semiconductor layer with the first insulating film and a second boundary region that is a boundary region of the p-type semiconductor layer with the second insulating film, and
   n-type impurities are implanted in the first boundary region of the p-type semiconductor layer.

2. The semiconductor device according to claim 1, wherein the concentration peak is in an inner 80% region of a total thickness of the p-type semiconductor layer.

3. The semiconductor device according to claim 1, wherein the concentration peak is at a position apart by at least 20 nm from a boundary between the p-type semiconductor layer and the first insulating film and a boundary between the p-type semiconductor layer and the second insulating film.

4. The semiconductor device according to claim 1, wherein n-type impurities are implanted in the second boundary region of the p-type semiconductor layer.

5. The semiconductor device according to claim 1, wherein the p-type semiconductor layer and the n-type semiconductor layer are made of polysilicon, and the first insulating film and/or the second insulating film are made of silicon dioxide film.

6. The semiconductor device according to claim 1, wherein the p-type impurities are boron.

7. The semiconductor device according to claim 1, further comprising
a MOS structure,
wherein principal current flows from one principal surface to another principal surface of the semiconductor substrate,
wherein the one principal surface of the semiconductor substrate includes an active region through which the principal current flows, and a voltage supporting region that surrounds the active region and contains a peripheral portion of the semiconductor substrate,
the first insulating film is formed on the voltage supporting region, and
the Zener diode is an overvoltage protection diode configured to include the n-type semiconductor layer and the p-type semiconductor layer alternately arranged adjacent to each other.

8. The semiconductor device according to claim 7, wherein the semiconductor substrate is of a first conductive type,
the semiconductor device further comprises:
a second conductive type diffusion layer that is selectively formed on one principal surface in the voltage supporting region, and surrounds the active region;
a first conductive type diffusion region formed in the diffusion layer;
an emitter electrode formed on the diffusion region;
a gate electrode formed on the overvoltage protection diode;
a second conductive type collector region formed on another principal surface of the semiconductor substrate; and
a collector electrode formed on the collector region.

9. The semiconductor device according to claim 7, wherein the semiconductor substrate is of a first conductive type,
the semiconductor device further comprises:
a second conductive type diffusion layer that is selectively formed on one principal surface in the voltage supporting region, and surrounds the active region;
a first conductive type diffusion region formed in the diffusion layer;
an emitter electrode formed on the diffusion region;
a gate electrode formed on the overvoltage protection diode;
a first conductive type drain region formed on another principal surface of the semiconductor substrate; and
a collector electrode that is formed on the drain region, and forms a Schottky barrier together with the drain region.

10. The semiconductor device according to claim 7, wherein the semiconductor substrate is of a first conductive type,
the semiconductor device further comprises:
a second conductive type diffusion layer that is selectively formed on the one principal surface in the voltage supporting region, and surrounds the active region;
a first conductive type diffusion region formed in the diffusion layer;
a source electrode formed on the diffusion region;
a gate electrode formed on the overvoltage protection diode;
a first conductive type drain region formed on another principal surface of the semiconductor substrate; and
a drain electrode formed on the drain region.

* * * * *